United States Patent [19]
Ohmori et al.

[11] Patent Number: 6,022,763
[45] Date of Patent: Feb. 8, 2000

[54] SUBSTRATE FOR SEMICONDUCTOR DEVICE, SEMICONDUCTOR DEVICE USING THE SAME, AND METHOD FOR MANUFACTURE THEREOF

[75] Inventors: Jun Ohmori, Tokyo; Hiroshi Iwasaki; Takanori Jin, both of Yokohama, all of Japan

[73] Assignee: Kabushiki Kaisha Toshiba, Japan

[21] Appl. No.: 09/085,108

[22] Filed: May 28, 1998

Related U.S. Application Data

[62] Division of application No. 08/644,897, May 10, 1996, Pat. No. 5,780,933.

[51] Int. Cl.[7] ............ H01L 21/44; H01L 21/48; H01L 21/50
[52] U.S. Cl. ............ 438/127; 438/106; 438/124; 438/126
[58] Field of Search ............ 438/106, 124, 438/126, 127

[56] References Cited

U.S. PATENT DOCUMENTS

| | | |
|---|---|---|
| 4,264,917 | 4/1981 | Ugon . |
| 4,907,061 | 3/1990 | Kohara . |
| 4,916,662 | 4/1990 | Mizuta . |
| 4,943,464 | 7/1990 | Gloton et al. . |
| 5,091,618 | 2/1992 | Takahashi . |
| 5,153,818 | 10/1992 | Mukougawa et al. . |
| 5,155,663 | 10/1992 | Harase . |
| 5,272,374 | 12/1993 | Kodai et al. . |
| 5,276,317 | 1/1994 | Ozouf et al. . |
| 5,297,148 | 3/1994 | Harari et al. . |
| 5,299,089 | 3/1994 | Lwee . |
| 5,375,037 | 12/1994 | LeRoux . |
| 5,469,399 | 11/1995 | Sato et al. . |
| 5,508,971 | 4/1996 | Cernea et al. . |
| 5,535,328 | 7/1996 | Harari et al. . |

(List continued on next page.)

FOREIGN PATENT DOCUMENTS

| | | |
|---|---|---|
| 0 214 478 | 3/1987 | European Pat. Off. . |
| 0 228 278 | 7/1987 | European Pat. Off. . |
| 0 321 326 | 6/1989 | European Pat. Off. . |
| 0 385 750 | 9/1990 | European Pat. Off. . |
| 0390996 | 10/1990 | European Pat. Off. ............ 257/679 |
| 0 406 610 | 1/1991 | European Pat. Off. . |
| 0 476 892 | 3/1992 | European Pat. Off. . |
| 60-106153 | 6/1985 | Japan ............ 257/787 |
| 62-120054 | 6/1987 | Japan ............ 257/787 |
| 2205064 | 8/1990 | Japan ............ 257/788 |
| 2-301155 | 12/1990 | Japan . |
| 3-14192 | 1/1991 | Japan . |
| 3-2099 | 1/1991 | Japan . |
| 3-114788 | 5/1991 | Japan . |
| 3105961 | 5/1991 | Japan ............ 257/787 |
| 4-16396 | 1/1992 | Japan . |
| 4-148999 | 5/1992 | Japan . |
| 5-134820 | 6/1993 | Japan . |
| 6-195524 | 7/1994 | Japan . |
| 6-236316 | 8/1994 | Japan . |
| 6-318390 | 11/1994 | Japan . |

OTHER PUBLICATIONS

E. Harari, Nikkei Electronics, Feb. 17, 1992, pp. 155–168.

*Primary Examiner*—John F. Niebling
*Assistant Examiner*—David A. Zarneke
*Attorney, Agent, or Firm*—Finnegan, Henderson, Farabow, Garrett & Dunner, L.L.P.

[57] ABSTRACT

A one-sided sealed type semiconductor device comprising a substrate proper for a one-sided resin mold provided on the first main surface thereof with a wiring circuit including connection parts for semiconductor elements and on the second main surface thereof with flat type external connection terminals led out thereon via a through hole, semiconductor elements set in place and packaged in predetermined areas of the first main surface of the substrate proper, a transfer mold resin layer for sealing solely the surface having the semiconductor elements packaged thereon, and a metallic layer formed on the first main surface independently of wiring circuit and outside the area having the wiring circuit.

4 Claims, 3 Drawing Sheets

U.S. PATENT DOCUMENTS

| | | |
|---|---|---|
| 5,550,709 | 8/1996 | Iwasaki . |
| 5,552,632 | 9/1996 | Iwaski . |
| 5,563,825 | 10/1996 | Cernea et al. . |
| 5,568,424 | 10/1996 | Cernea et al. . |
| 5,572,478 | 11/1996 | Sato et al. . |
| 5,592,420 | 1/1997 | Cernea et al. . |
| 5,596,532 | 1/1997 | Cernea et al. . |
| 5,602,987 | 2/1997 | Harari et al. . |
| 5,608,673 | 3/1997 | Rhee . |
| 5,621,685 | 4/1997 | Cernea et al. . |
| 5,638,321 | 6/1997 | Lee et al. . |
| 5,663,901 | 9/1997 | Wallace et al. . |
| 5,693,570 | 12/1997 | Cernea et al. . |

SUBSTRATE FOR SEMICONDUCTOR DEVICE, SEMICONDUCTOR DEVICE USING THE SAME, AND METHOD FOR MANUFACTURE THEREOF

This is a division of application Ser. No. 08/644,897, filed May 10, 1996, which application is entirely incorporated herein by reference now U.S. Pat. No. 5,780,933.

BACKGROUND OF THE INVENTION

1. Field of the Invention

This invention relates to a substrate for a semiconductor device, a semiconductor device using the substrate, and a method for the manufacture of the semiconductor device, and more particularly to a substrate for a semiconductor device fit for the construction of a thin semiconductor package of a one-sided seal type, a semiconductor device using the substrate, and a method for the manufacture of the semiconductor device.

2. Description of the Related Art

In the construction of various memory cards, since the cards are restricted by top size and thickness, the semiconductor devices (or semiconductor packages) that contribute to such factors as the memory function are being demanded to be produced in a decreased standard thickness. These semiconductors, at the same time, are demanded to equal roughly the semiconductor elements (semiconductor chips) in size and enjoy compactness.

Such measures as the flip chip packaging method and the chip on board (COB) method have been heretofore known to fulfill the demand for thin layer packaging in the construction of memory cards, specifically the necessity for packaging the cards in a space of not more than 1 mm, for example, in the direction of thickness. As respects the thin semiconductor packages, those which have mutually different essential components laid out as shown in cross section in FIG. 5 and FIG. 6 have been known in the art.

In FIG. 5 and FIG. 6, 1 stands for a substrate provided on one main surface thereof a wiring circuit 1a including a connection part, 2a and 2b for semiconductor chips (flip chips) mounted and packaged on the main surface of the substrate 1, 3 for an external connection terminal led out to the other main surface side of the substrate 1 via a through hole (through-hole junction) 4, and 5 for a sealing resin layer for sealing such an area as intervenes between the semiconductor chips 2a, 2b and the surface of the substrate 1. This substrate 1 uses for an insulator therefor a glass fiber-reinforced resin like a glass-epoxy resin or a ceramic like alumina or aluminum nitride. In FIG. 5 and FIG. 6, 6 stands for a bonding wire for electrically connecting the junction part of the wiring circuit 1a mentioned above to electrode terminals on the surfaces of the semiconductor chips 2a, 2b, and 7 for an adhesive agent layer for attaching fast the semiconductor chips 2a, 2b to predetermined areas of the substrate 1.

The semiconductor device of the one-sided resin seal type shown in FIG. 5 and FIG. 6 is generally manufactured as follows.

As shown in FIG. 7 which depicts essential components in cross section, a lower metallic mold 8 which is provided with a plunger 8a for setting in place and supplying a resin tablet 5a, for example, and a depressed part 8b for setting in place and disposing an assembling substrate 9 and an upper metallic mold 10 which is matched to the lower metallic mold 8 and provided with a depressed part 10b for setting in place and disposing the assembling substrate 9 and a runner part 10a for supplying the melt of the resin tablet 5a are prepared. The depressed part 8b of the lower metallic mold 8 and the depressed part 10b of the upper metallic mold 10 jointly form a so-called cavity.

Then, the assembling substrate 9 having necessary semiconductor chips 2a, 2b set in place and packaged on one main surface of the substrate 1 is set in place and disposed in the depressed part 8b of the lower metallic mold 8. Meanwhile, the tablet 5a of such a thermosetting resin as, for example, epoxy resin is set in place. Subsequently, the upper metallic mold 10 is set in place as aligned with the lower metallic mold 8 having the assembling substrate 9 set in place and disposed thereon to establish a setup for carrying out transfer mold. The thermosetting resin tablet 5a mentioned above is thermally softened and introduced via the runner part 10a and a gate part 10c into the cavity (8b, 10b). After the sealing resin has been supplied to one surface side of the assembling substrate 9 as described above, the sealing resin so supplied is allowed to harden. Thereafter, the metallic molds 8, 10 are separated to obtain such a package body as shown in cross section in FIG. 8.

In FIG. 8, 5' stands for the hardened resin layer in the area corresponding to the runner part 10a and the plunger 8a which extend outwardly from the gate part 10c. This hardened excess resin layer is cut off in the gate part 10c by being folded and rotated near a point 10d at which the end face part of the substrate abuts the hardened resin layer 5'. For the sake of simplicity of description, the mode of manufacturing one package body is depicted here by way of illustrations Generally, the metallic molds mentioned above are so constructed that a plurality of assembling substrates 9 may be set in place and disposed in one plane, with one plunger 8a connected to a plurality of runner parts 10a.

The one-sided mold semiconductor package constructed as described above indeed is at an advantage in safely tolerating the so-called "burn in" test to be performed for the purpose of detecting a defect which would be inherently manifested as a semiconductor chip in the near future before the package is set in place and packaged on a circuit substrate. It nevertheless incurs frequently the following problem. When the sealing resin layer 5 and the excess resin layer 5' are to be cut and separated after the transfer mold mentioned above, they are not broken at the gate part 10c as expected because the sealing resin layer 5 and the excess resin layer 5' manifest high adhesive strength to the surface of the substrate 1. If the separation is forced at all, it often occurs that the sealing resin layer 5 will peel or the substrate 1 will sustain damage or the breakage will occur halfway in the entire length of the runner part 10a.

The peel of the sealing resin layer 5 or the damage of the substrate 1 implies that the reliability of product is at stake and the yield and the automatic productivity are jeopardized. The breakage of the excess resin layer 5' at a point halfway in the entire length of the runner part 10a not only impairs the appearance and dimensional accuracy of the one-sided mold semiconductor package (semiconductor device) but also induces infliction of damage on the substrate 1 and lowers the yield.

SUMMARY OF THE INVENTION

This invention, produced for the purpose of coping with the true state mentioned above, aims to provide a substrate fit for the construction of a one-sided sealing type semiconductor device which is suitable for packaging and setting in place thin and highly reliable memory cards, a one-sided resin sealing type semiconductor device using the substrate, and a method for the manufacture of the one-sided resin sealing type semiconductor device.

The first aspect of this invention is a substrate for a one-sided sealed semiconductor device comprising a substrate proper for a one-sided resin mold, a wiring circuit including connection parts for a semiconductor element on a first main surface of the substrate proper, a flat-type external connection terminals led out on a second main surface of the substrate proper via through holes, and a metallic layer formed on the first main surface independently of the wiring circuit and outside an area of the wiring circuit.

The second aspect of this invention is a one-sided sealed type semiconductor device, comprising a substrate proper providing a wiring circuit including connection parts for a semiconductor element on a first main surface of the substrate proper and a flat-type external connection terminals led out on a second main surface of the substrate proper via through holes, the semiconductor element mounted and packaged on the first main surface of the substrate proper, a transfer mold resin layer sealed solely the first main surface with the mounted semiconductor element and the wiring circuit, and a metallic layer formed on the first main surface outside an area of the wiring circuit and extended from an area of the mold resin layer to an adjoining outside area of the mold resin layer.

In the semiconductor device according to the second aspect the metallic layer is provided on a portion of the first main surface, the portion being a runner part for transfer molding when the resin is filled into the area of mold resin layer.

The third aspect of this invention is a method comprising the steps of forming a wiring circuit pattern including connection parts for a semiconductor element and a metallic layer at a predetermined position of a first main surface of a substrate, and a metallic layer extended outwardly and separately from an area of the predetermined position, forming planar external connection terminals at predetermined positions of a second main surface of the substrate, forming through holes for electrically connecting the wiring pattern to the external connection terminals, mounting and packaging the semiconductor element in the predetermined position to form an assembly, setting in place and disposing the assembly in a metallic mold for transfer molding, the metallic mold comprising a lower metallic mold having a depressed part for setting in place and disposing the assembly, an upper metallic mold matched to the upper metallic mold and having a depressed part for setting in place and disposing the assembly, and a runner part including a gate part for supplying a melt of resin, supplying molding resin by a plunger via the runner part and the gate part into the metallic mold, filling the metallic mold with the molding resin to form a one-sided sealed substrate in which the semiconductor element and the wiring circuit pattern are sealed on the first main surface of the substrate, hardening the molding resin in the metallic mold, removing the one-sided sealed substrate from the metallic mold, and cutting and separate an excess resin layer remaining in the runner part and the plunger.

Further, in the method for manufacturing a semiconductor device, the metallic layer is formed on the first main surface as extended from a resin sealing area through the runner part across the gate part.

More further, in the method for manufacturing a semiconductor device, the cutting and separating of the excess resin layer is carried out by bending the excess resin body toward a second main surface side at an end surface part of the substrate as a fulcrum.

The fourth aspect of the invention is a method for manufacturing a one-sided sealed semiconductor device comprising the steps of forming a substrate comprising a first main surface and a second main surface, a semiconductor element mounted on the first main surface, flat type external connection terminals formed on the second main surface, the flat type external connection terminals being input/output terminals of the semiconductor device and connected with the semiconductor device, and a metallic layer formed on the first main surface except a semiconductor mounted area, one-sided molding the substrate in a mold to form a molding resin layer covered the semiconductor element mounted on the first main surface of the substrate, the one-sided molding being carried out by filling a molding resin on the first main surface of the substrate in the mold through the metallic layer provided on a runner part, and cutting and separating an excess molding layer remaining in the runner part from the one-sided sealed semiconductor device.

The term "metallic layer" as used in the aspects of this invention described above refers to a layer which is formed of at least one metal selected from the group consisting of gold, silver, and other similar metals, by such means as the plating method or the sputtering method, generally in a thickness in the approximate range of 0.3 to 1.0 $\mu$m.

In the first aspect of this invention, since the metallic layer manifesting low adhesive strength to the molding resin is selectively formed and partially reinforced in the area of one main surface (corresponding to the gate part) corresponding to the position at which the runner part for supplying the molding resin is destined to be cut, the runner part can be easily and infallibly cut and separated at the stated position of the gate part by inserting a cut in the gate part after the transfer molding.

In the second aspect of this invention, since the mold resin layer formed by the transfer molding in the area corresponding to the gate part and the runner part is cut and removed in good appearance with high dimensional accuracy, a memory card can be easily constructed compactly in a satisfactorily small thickness.

In the third and fourth aspects of this invention, the mold resin layer formed by the transfer molding in the area corresponding to the gate part and the runner part is cut and removed in good appearance with high dimensional accuracy to allow semiconductor devices of high reliability fit for the construction of amply thin and compact memory cards to be obtained with high yield on the scale of mass production.

DESCRIPTION OF THE PREFERRED EMBODIMENTS

Now, an embodiment of this invention will be described below with reference to FIG. 1 and FIG. 2.

Figure 1:
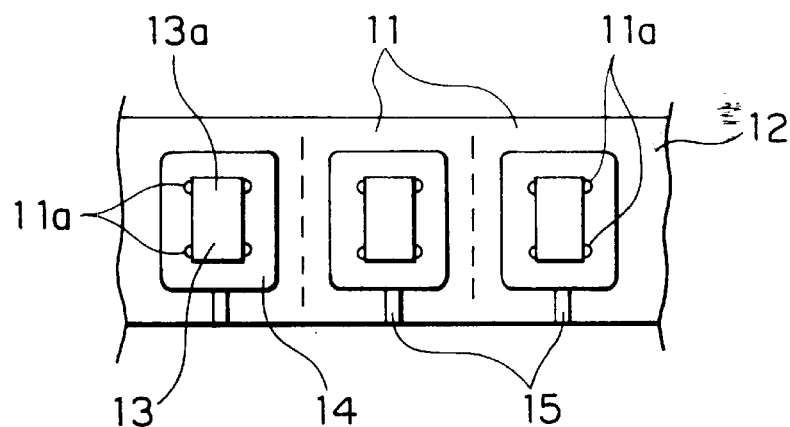
FIG. 1 is a top view showing an example of the construction of essential components of a semiconductor device substrate according to this invention.

FIG. 1 is a top view showing an example of the construction of essential components of a semiconductor device substrate according to this invention. In FIG. 1, 11 represents a substrate proper which is ultimately separated. The substrate proper 11 comprises a ribbonlike substrate 12 measuring 40 mm in width and 0.2 to 0.3 mm in thickness, for example, and wiring circuits 11a including relevant connecting parts and formed on the first main surface of the ribbonlike substrate 12.

Then, 13 represents an area for setting in place and packaging a semiconductor chip 13a and 14 represents a mold resin sealing area for sealing the semiconductor chip 13a set in place and packaged as mentioned above.

By 15 is represented a metallic layer which is disposed outside the area of the wiring circuits 11a of the substrate proper 11 and selectively formed on the first main surface as extended from the mold resin seal area 14 through the supply runner part for sealing resin across a gate part formed in the connecting part leading from the runner part for sealing resin to the cavity part.

Incidentally, the substrate proper 11 mentioned above is a thin substrate which is made of such substance as glass epoxy resin or glass fiber-reinforced BT resin. On the first main surface of the substrate proper 11, the wiring circuits 11a are formed. Further, in the substrate proper 11, flat type external connection terminals 17 (FIG. 2) are formed on the rear surface side (the second main surface) as electrically connected to the wiring circuits 11a on the first main surface via through hole or field via hole connecting parts 16. The external connection terminals 17 are not particularly restricted by pattern of layout. When they are arrayed latticewise at fixed pitches, they can be used as connection terminals for electric tests.

The ribbonlike substrate 12 of this construction, for example, can be produced as follows. A glass-epoxy sheet about 0.5 mm in thickness having copper foils about 28 $\mu$m in thickness applied one each to the opposite sides thereof is prepared. A wiring circuit pattern is formed at a predetermined position on the first main surface of the sheet by etching the copper foil forming the first main surface and an external connection terminal pattern is likewise formed on the second main surface. Then, through holes or holes for the field via hole connecting part are bored at relevant positions in the substrate proper 11. Subsequently, the surfaces of the through holes or the field via holes mentioned above are plated by the electroless plating technique and further electrolytically plated until the holes are filled.

The wiring circuit pattern formed on the first main surface and the external connection terminal pattern formed on the second main surface are plated with nickel in a thickness of about 5 $\mu$m and further electrolytically plated with gold in a thickness of about 0.5 $\mu$m to give birth respectively to a wiring circuit 11a and an external connection terminal 17.

In this case, the metallic layer 15 is formed at a predetermined position on the substrate at the same time that the wiring circuit 11a is formed on the first main surface. The gold surface layer of the metallic layer 15 is obtained by the electrolytic plating technique using a soft gold material of a relatively high purity. For the external connection terminal 17 to be formed on the second main surface, a hard gold material is used for the sake of providing duly high resistance to wear.

The present embodiment contemplates use of gold as the surface material for the metallic layer. The surface material does not need to be limited to gold. Some other metallic material may be used instead so long as it manifest a duly high peeling property to the mold resin material.

Besides the glass-epoxy resin, a BT resin (bismaleic acid triazine resin) reinforced with glass fibers and bismaleic acid butylene terephthalate resin are generally used for the substrate. For protecting the substrate proper 11 against such adverse phenomena as warping and noise, a dummy wiring pattern of the wholly solid pattern may be disposed as an inner layer in the peripheral part of the substrate proper 11.

Figure 2:
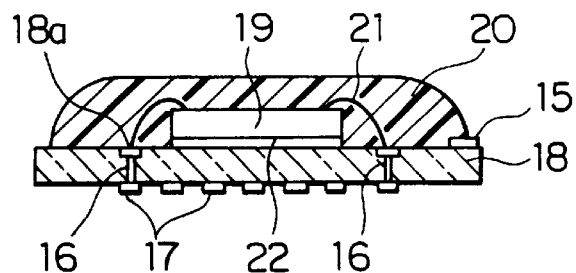
FIG. 2 is a cross section showing an example of the construction of essential components of the semiconductor device according to this invention.

FIG. 2 cross-sectionally shows the essential part of a typical construction of the semiconductor device according to this invention. In FIG. 2, 18 represents a substrate provided on one main surface thereof with the wiring circuit 18a including a connection part, 19 a semiconductor chip (flip chip) set in place and packaged on the one main surface of the substrate 18 mentioned above, 17 the external connection terminal lead out to the other main surface side of the substrate via the through hole (through hole connection) 16, and 20 a sealing resin layer for sealing the area intervening as between the semiconductor chip 19 and the surface of the substrate 18. Further in FIG. 2, 21 represents a bonding wire for electrically connecting the connection part of the wiring circuit 18a and the electrode terminal on the surface of the semiconductor chip 19 and 22 an adhesive agent layer for joining the semiconductor chip 19 fast to a predetermined area of the substrate 18.

Now, a typical procedure for the manufacture of the semiconductor device of the construction described above will be explained.

Figure 3:
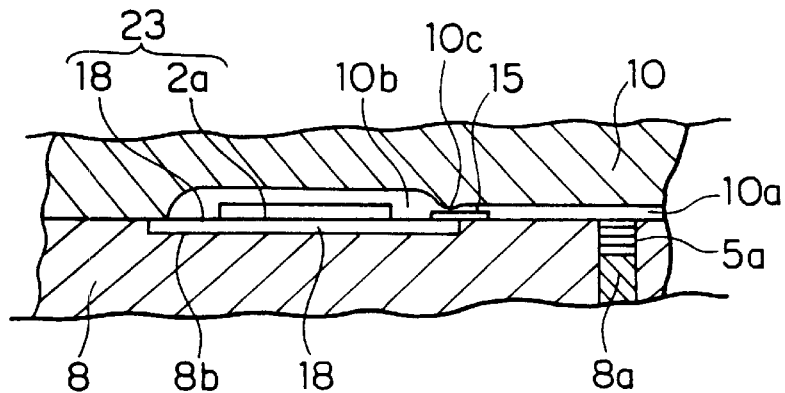
FIG. 3 is a cross section showing schematically a method for forming a thin semiconductor device by the transfer mold technique according to this invention.

First, a transfer mold device having such a main feature as depicted cross-sectionally in FIG. 3 is prepared. Specifically, the lower metallic mold 8 which is provided with the plunger 8a for setting in place and supplying the resin tablet 5a and the depressed part 8b for setting in place and disposing an assembling substrate 23 and the upper metallic mold 10 which is matched to the lower metallic mold 8 mentioned above and provided with the depressed part 10 for setting in place and disposing the assembling substrate 23 and the supplying runner part 10a for supplying the melt of the resin tablet 5a are prepared. The depressed part 8b of the lower metallic mold 8 and the depressed part 10b of the upper metallic mold jointly form the so-called cavity. Then, the assembling substrate 23 having the prescribed semiconductor chip 2a set in place and packaged on the first main surface and destined to form the substrate 18 is set in place and disposed in the depressed part 8b of the lower metallic mold 8 and the tablet 5a of such thermosetting resin as epoxy resin is meanwhile set in place.

The assembling substrate 23 mentioned above is such that on the surface of the substrate proper 11 mentioned above, the metallic layer 15 is disposed outside the wiring circuit 11a and the area of the wiring circuits 11a, and in the portion of the sealing resin supply runner part extended from the wiring circuit 11a mold resin seal area 14 to the externally adjoining area and destined to be cut, as shown in FIGS. 1 and 2.

Then, the upper metallic mold 10 is set in place as aligned with the lower metallic mold 8 having the assembling substrate 23 set in place and disposed thereon to establish a setup for carrying out transfer mold and the thermosetting resin tablet 5a mentioned above is thermally softened and introduced via the runner part 10a and a gate part 10c into the cavity (8b, 10b). After the sealing resin has been supplied to one surface side of the assembling substrate 9 as described above, the sealing resin so supplied is allowed to harden. Thereafter, the metallic molds 8, 10 are separated to obtain a semiconductor device (package body).

Figure 4:
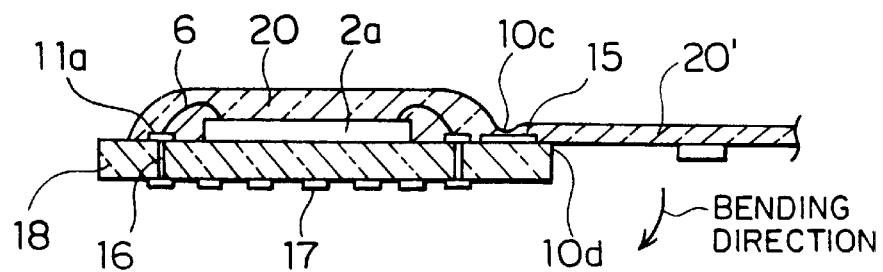
FIG. 4 is a cross section showing schematically an example of the formation of a thin semiconductor device molded by the transfer molding technique according to this invention.
Figure 5:
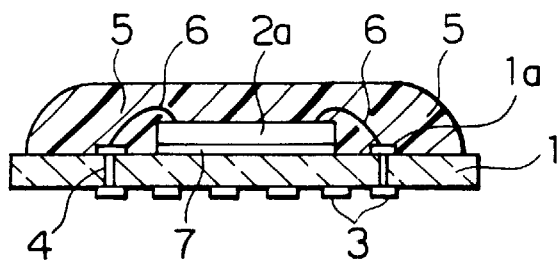
FIG. 5 is a cross section showing an example of the construction of essential components of a conventional thin semiconductor device.
Figure 6:
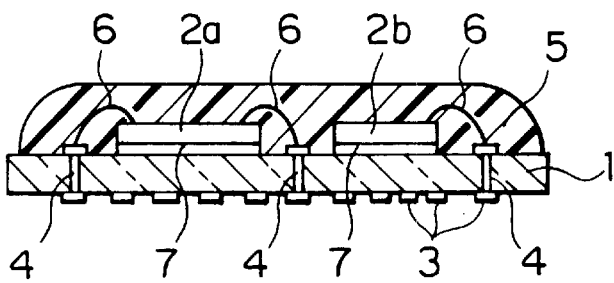
FIG. 6 is a cross section showing an example of the construction of essential components of another conventional thin semiconductor device.
Figure 7:
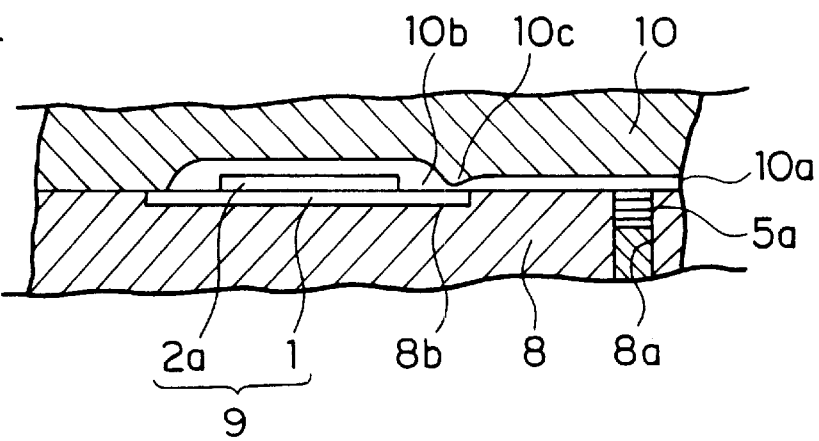
FIG. 7 is a cross section showing schematically a conventional method for the formation of a thin semiconductor device by the transfer molding technique.
Figure 8:
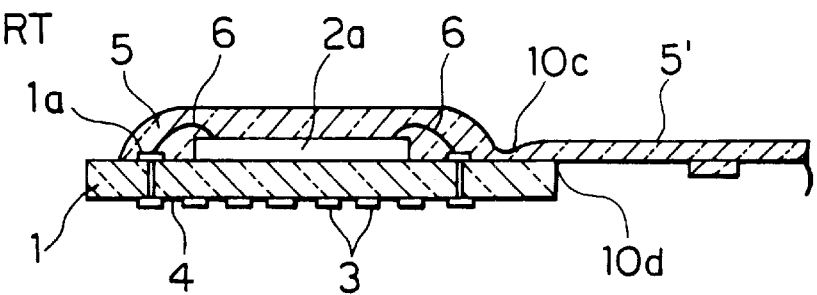
FIG. 8 is a cross section showing schematically an example of the formation of a thin semiconductor device molded by the conventional transfer molding technique.

In the semiconductor device obtained as described above, a hardened area excess resin layer 20' exists also in the areas corresponding to the runner part 10a extending from the gate part 10c and the plunger 8a as shown in FIG. 4.

The excess hardened resin layer 20' can be easily and infallibly cut at the gate part 10c and peeled off by bending the hardened resin layer 20' toward the second main surface side at the end surface part 10d of the substrate 18 as a fulcrum. Owing to the provision of the metallic layer 15 which manifests an outstanding peeling property to the sealing resin, the unwanted resin layer can be infallibly broken and removed at the position duly expected without inducing infliction of damage on the substrate 18. As a result, the semiconductor device of perfect dimensional accuracy and reliability can be manufactured with high yield.

In this case, it is important that the excess resin layer 20' should be bent toward the second main face side using the end part surface part of the substrate proper as the fulcrum. If the excess hardened resin layer 20' is folded or rotated opposite to the second main surface side so as to be cut and separated, the possibility of the bent part of the layer 20' inflicting damage directly on the semiconductor device (package) will be increased because very fast adhesion is established between the hardened resin layer 20 formed on the first main surface and the first main surface of the substrate. In the method of this invention for the manufacture of the semiconductor device, therefore, it is important that the excess hardened resin layer 20', while being cut, should be bend toward the second main surface side of the semiconductor proper.

Thus, in the present invention, the excess hardened resin layer can be infallibility cut at the gate part with a 100% yield.

In contrast, according to the conventional method, the semiconductor package that the excess resin layer is cut at the gate part is only 80%. Thus, it has been forced to scrap defective packages or to finish the cutting part thereof.

Accordingly, in the present invention, the semiconductor device of perfect dimensional accuracy and reliability can be easily manufactured with high yield.

The embodiment described above contemplates the mode of manufacturing one package body for the sake of simplicity of description. Generally, the metallic molds mentioned above adopt a construction which is capable of setting in place and disposing a plurality of assembling substrates 23 in one plane, with one plunger 8a connected to a plurality of runner parts 10a.

This invention does not need to be limited to the embodiments cited above but may admit various changes and modifications without departing from the spirit and scope of this invention. As respects the electronic part to be set in place and packaged, for example, a plurality of semiconductor chips optionally combined with other chip components such as capacitors and resistors or with crystal oscillators may be used in the place of one semiconductor chip. The electrical connecting method is not limited to the wire bonding technique. The flip chip technique and the tape automated bonding (TAB) technique may be used instead.

It is clearly noted from the description given above that the substrate of this invention for the semiconductor device has a metallic layer selectively disposed in advance at a portion of the surface of the substrate that corresponds to the gate part existent during the course of resin sealing. The adhesive strength of the sealing resin is lower to the metallic layer than to the surface of the substrate. When the part of the resin layer corresponding as to the runner part is bent at the end surface part of the substrate as a fulcrum, therefore, it can be easily cut and separated at the gate part without peeling or damaging the seal mold layer of the semiconductor chip or inflicting damage on the substrate. When a semiconductor chip is set in place and packaged on the substrate for semiconductor device mentioned above and then so processed as to give rise to a semiconductor device having one surface thereof sealed with a resin, the produced semiconductor device enjoys good appearance and high dimensional accuracy and admits such compaction as induces a decrease in thickness. Owing to these merits coupled with the feature of detachability, the product functions as a packaging part of high reliability.

Figure 9:
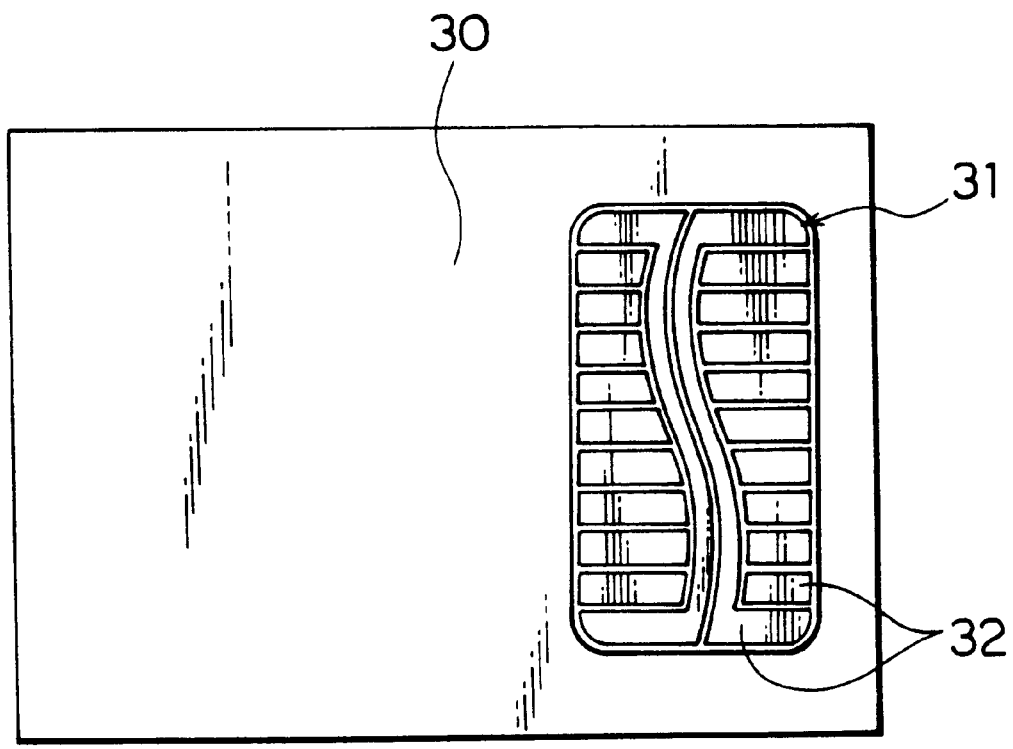
FIG. 9 is a plan view showing an example of the construction of a memory card incorporating therein the thin semiconductor device of this invention.

FIG. 9 shows one example of the solid state floppy disk card (SSFDC) which has an over molded thin package (OMTP) 31, a typical application of the semiconductor device of this invention, mounted at a predetermined position of a thin plastic card 30. In the diagram, 32 represents a falt type external connection terminal formed on the second main surface of the semiconductor device.

As illustrated by the typical application mentioned above, the substrate for semiconductor device and the semiconductor device according to this invention enjoys good appearance and high dimensional accuracy and admits such compaction as induces a decrease in thickness. Owing to these merits coupled with the feature of detachability, therefore, these products of this invention function as packaging parts of high reliability.

What is claimed is:

1. A method for manufacturing a semiconductor device comprising the steps of:

forming a wiring circuit pattern including connection parts for a semiconductor element and a metallic layer at a predetermined position of a first main surface of a substrate, and a metallic layer extended outwardly and separately from an area of the predetermined position, forming planar external connection terminals at predetermined positions of a second main surface of the substrate, forming through holes for electrically connecting the wiring pattern to the external connection terminals, mounting and packaging the semiconductor element in the predetermined position to form an assembly, setting in place and disposing the assembly in a metallic mold for transfer molding, the metallic mold comprising a lower metallic mold having a depressed part for setting in place and disposing the assembly, an upper metallic mold matched to the upper metallic mold and having a depressed part for setting in place and disposing the assembly, and a runner part including a gate part for supplying a melt of resin, supplying molding resin by a plunger via the runner part and the gate part into the metallic mold, filling the metallic mold with the molding resin to form a one-sided sealed substrate in which the semiconductor element and the wring circuit pattern are sealed on the first main surface of the substrate, hardening the molding resin in the metallic mold, removing the one-sided sealed substrate form the metallic mold, and cutting and separate and excess resin layer remaining in the runner part and the plunger.

2. The method for manufacturing a semiconductor device according to claim 1, wherein the metallic layer is formed on the first main surface as extended from a resin sealing area through the runner part across the gate part.

3. The method for manufacturing a semiconductor device according to claim 1, wherein the cutting and separating of the excess resin layer is carried out by bending the excess resin body toward a second main surface side at an end surface part of the substrate as a fulcrum.

4. A method for manufacturing a one-sided sealed semiconductor device comprising the steps of:

forming a substrate comprising a first main surface and a second main surface, a semiconductor element mounted on the first main surface, flat type external connection terminals formed on the second main surface, the flat type external connection terminals being input/output terminals of the semiconductor device and connected with the semiconductor device, and a metallic layer formed on the first main surface except a semiconductor mounted area;

one-sided molding the substrate in a mold to form a molding resin layer covered the semiconductor element mounted on the first main surface of the substrate, the one-sided molding being carried out by filling a molding resin on the first main surface of the substrate in the mold through the metallic layer provided on a runner part; and cutting and separating an excess molding layer remaining in the runner part from the one-sided sealed semiconductor device.

\* \* \* \* \*

UNITED STATES PATENT AND TRADEMARK OFFICE
CERTIFICATE OF CORRECTION

PATENT NO.: 6,022,763

DATED: February 8, 2000

INVENTOR(S): Ohmori et al.

It is certified that an error appears in the above-identified patent and that said Letters Patent is hereby corrected as shown below:

Claim 1, column 9, line 7, delete "wring" and insert --wiring--; and line 12, delete "cutting and separate and excess" and insert --cutting and separating an excess--.

Signed and Sealed this

Twentieth Day of March, 2001

Attest:

NICHOLAS P. GODICI

*Attesting Officer*     *Acting Director of the United States Patent and Trademark Office*